(12) United States Patent
Kuehn

(10) Patent No.: US 7,006,159 B2
(45) Date of Patent: Feb. 28, 2006

(54) ADAPTER CIRCUIT FOR AUDIO AND VIDEO SIGNALS

(75) Inventor: Hans Juergen Kuehn, Buchholz (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 562 days.

(21) Appl. No.: 09/922,141

(22) Filed: Aug. 3, 2001

(65) Prior Publication Data

US 2002/0054245 A1 May 9, 2002

(30) Foreign Application Priority Data

Aug. 5, 2000 (DE) ............................ 100 38 321

(51) Int. Cl.
*H04N 5/14* (2006.01)
*H03K 5/12* (2006.01)

(52) U.S. Cl. ........................ 348/707; 327/170
(58) Field of Classification Search ........... 348/707, 348/730; 327/53, 66; 330/255, 256, 257, 330/288; 345/204, 205, 206
See application file for complete search history.

(56) References Cited

U.S. PATENT DOCUMENTS

| | | | | |
|---|---|---|---|---|
| 3,996,609 A | * | 12/1976 | Avery | 348/659 |
| 4,318,052 A | * | 3/1982 | Colles | 330/255 |
| 4,349,778 A | * | 9/1982 | Davis | 323/314 |
| 4,525,683 A | * | 6/1985 | Jason | 330/288 |
| 4,853,647 A | * | 8/1989 | Low et al. | 330/256 |
| 4,941,204 A | * | 7/1990 | Zuffada et al. | 455/64 |
| 5,264,782 A | * | 11/1993 | Newton | 323/288 |
| 5,589,762 A | * | 12/1996 | Iannuzo | 323/351 |
| 5,625,281 A | * | 4/1997 | Lambert | 323/315 |
| 5,631,599 A | * | 5/1997 | Bacrania et al. | 327/542 |
| 5,654,665 A | * | 8/1997 | Menon et al. | 327/541 |
| 5,663,674 A | * | 9/1997 | Beyer et al. | 327/540 |
| 5,724,519 A | * | 3/1998 | Kato et al. | 345/204 |
| 5,774,021 A | * | 6/1998 | Szepesi et al. | 330/257 |
| 5,789,955 A | * | 8/1998 | Scheraga | 327/170 |
| 5,939,902 A | * | 8/1999 | Iwata | 327/14 |
| 6,072,331 A | * | 6/2000 | Takizawa | 326/30 |
| 6,163,216 A | * | 12/2000 | Murray et al. | 330/255 |
| 6,184,750 B1 | * | 2/2001 | Somerville | 330/255 |
| 6,218,900 B1 | * | 4/2001 | Nolan | 330/255 |
| 6,316,967 B1 | * | 11/2001 | Takagi et al. | 327/50 |

FOREIGN PATENT DOCUMENTS

| | | |
|---|---|---|
| DE | 2824141 C2 | 12/1979 |
| EP | 0664606 A1 | 7/1995 |

* cited by examiner

*Primary Examiner*—Paulos M. Natnael
(74) *Attorney, Agent, or Firm*—Aaron Waxler

(57) ABSTRACT

A circuit arrangement includes at least one adapter circuit (10). which amplifies an analog input signal of a low current ($I_i$) by an amplification factor (n) into a particularly analog output signal of a higher current ($I_o$). The adapter circuit includes an input, which corresponds to a range of low voltages ($U_i$); an output (18), which corresponds to a range of higher voltages ($U_o$); at least one npn transistor current mirror (14); and at least one pnp transistor current mirror (16) arranged in series with the npn transistor current mirror (14), and connected to at least one high voltage source (30), wherein the at least one pnp transistor current mirror amplifies the input signal, which is received from the at least one npn transistor current mirror.

14 Claims, 1 Drawing Sheet

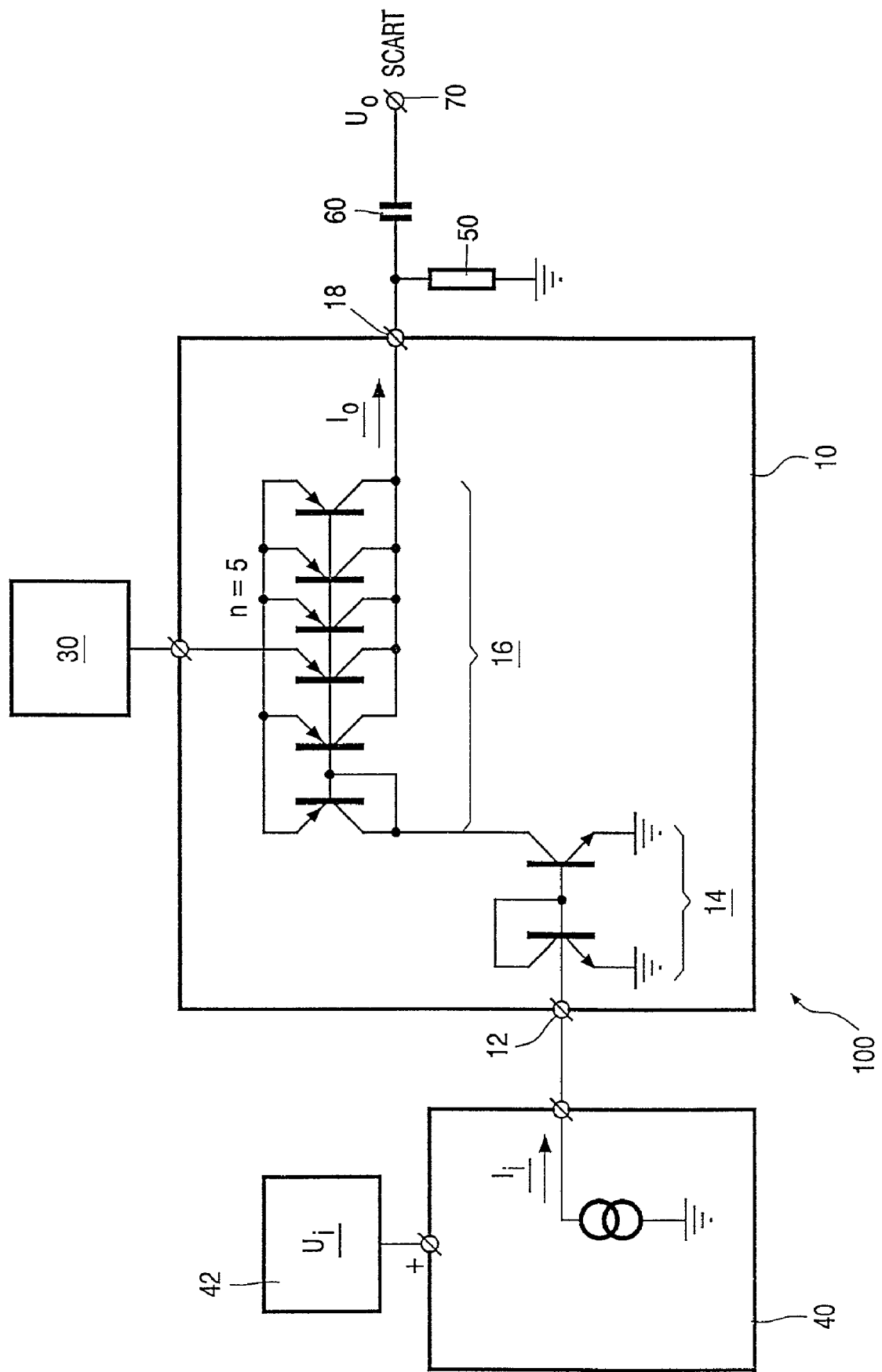

ADAPTER CIRCUIT FOR AUDIO AND VIDEO SIGNALS

The invention relates to a circuit arrangement, particularly for a television, multimedia, radio or video recording device, for transition from a range of low voltage to a range of higher voltage.

Such a circuit arrangement is known from DE 28 24 141 C2. This document describes a circuit arrangement for transition from an $I^2L$ circuit to a bipolar circuit having a higher power output and integrated preferably on the same semiconductor chip, comprising a pnp current mirror mirroring a signal current from the $I^2L$ logic in the bipolar circuit; the emitter base path of a bipolar transistor is arranged parallel to the input of the last inverter stage of the $I^2L$ circuit and its collector is connected to the input of the pnp current mirror.

This known circuit arrangement also provides a higher output power but it does not come up to the present-day technical standards when signals generated and processed in the low voltage range of an electric or electronic apparatus must be converted into output signals of a higher voltage suitable for the output of the apparatus, as is nowadays required in a multitude of electric and electronic apparatuses, particularly in the field of multimedia or also telecommunication.

In this respect, it should be noted that increasingly stricter requirements are imposed on the operating period and the voltage stability of such electric and electronic apparatuses, more particularly when portable apparatuses are concerned. In this respect, the tendency—which will even become more manifest in future—can be recognized that the operating voltage of integrated circuits (ICs) used in such apparatuses is even further reduced, also for thermal reasons.

It is an object of the invention to provide a circuit arrangement of the type described in the opening paragraph having a simple and low-cost structure and operating as an interface between a range of low voltage and a range of higher voltage in a stable and reliable way, also when the voltage difference between the range of low voltage and the range of higher voltage is large, for example, because the integrated circuits in a television, multimedia, radio or video recording device must be operated at a very low operating voltage, but where a relatively high output voltage is required at the output of the device.

This object is solved by the characteristic features defined in claim 1. Advantageous embodiments and further embodiments of the present invention are defined in the dependent claims.

In accordance with the teaching of the present invention, a preferably analog, particularly analog input signal of high precision and low current can be amplified by an amplification factor which, by way of example, may be of the order of 5 into a particularly analog output signal of a higher current by means of the at least one adapter circuit and in a way which is surprising to those skilled in the art.

To this end, the input of the adapter circuit is assignable to the low voltage range, for example in that the input of the adapter circuit precedes at least one supply or driver circuit constituted as an integrated circuit by which the low current input signal can be applied to the adapter circuit; in its turn, the supply or driver circuit is then preferably connected to at least one low voltage source (of the order of, for example approximately 1 V to approximately 3.3 V).

The adapter circuit further comprises at least one current mirroring npn transistor arrangement and at least one pnp current mirror arranged in series with the npn transistor current mirror, which is connected to at least one high voltage source (of the order of approximately 12 V) so that the amplification of the signal can be realized in the pnp transistor current mirror. The output of the pnp transistor current mirror behaves as a current source in this case, which means that the output signal leaving the adapter circuit is current-driven to a certain extent, i.e. not voltage-driven.

To realize the voltage adaptation by means of the adapter circuit, the output of the adapter circuit is assignable to the higher voltage range, while the output of the adapter circuit may precede at least one SCART (=Syndicat des Constructeurs d'Appareils Radio Receteurs et Televiseurs) output preferably for television, multimedia, radio or video recording devices.

Those skilled in the art will particularly appreciate in the present invention that the adapter circuit is current driven and that, in contrast to document DE 28 24 141 C2, this current is amplified within the adapter circuit. In comparison with the known adapter circuit, which can only be used for digital signals, this has the advantage that current-driven integrated circuits are insensitive to electromagnetic interference and disturbances, particularly to induced inductive and capacitive interference signals, which is an advantage which will be of increasing significance in the field of integrated circuits in future technology generations.

A further advantage of the present invention as compared with the adapter circuit disclosed in DE 28 24 141 C2 is that the major part of a "mixed analog/digital" technology can be used in the economically favorable low voltage range with the resultant desired small dimensions of the electric or electronic apparatuses and that only the adapter circuit of the present invention, to be operated in the high voltage technique, is used as a further integrated circuit ensuring a high output level required for, for example, a SCART connection.

It is therefore not necessary to incorporate all elements of the circuit arrangement on a single chip, but rather a strict structural separation of the low voltage circuits and ranges of the adapter circuit assigned to at least one high voltage source can be realized and, in contrast to the adapter circuit with the RL element at the positive potential known from DE 28 24 141 C2, a power supply ripple rejection can be achieved with the present invention, i.e. fluctuations and unsteady states in the voltage power supply can be prevented in a reliable manner.

To ensure a sufficient flexibility of the voltage of the output signal and simultaneously a high precision of the output level, the output of the adapter circuit preferably precedes a resistor for converting the output signal of a higher current into an output signal of a higher voltage.

These and other aspects of the invention are apparent from and will be elucidated with reference to the embodiments described hereinafter.

In the drawing:

FIG. 1 shows diagrammatically an embodiment of a circuit arrangement according to the invention.

The circuit arrangement 100 is intended for transition from a range of low voltage $U_i$ shown in the left-hand part of FIG. 1 to a range of higher voltage $U_o$ shown in the right-hand part of FIG. 1, for use in a television, multimedia, radio or video recording device.

The central part of the circuit arrangement 100 is an adapter circuit 10 amplifying an input signal having a low current $I_i$ into an output signal having a higher current $I_o$. To this end, the input 12 of the adapter circuit 10 is assignable to the range of low voltage $U_i$ in that the input 12 of the adapter circuit 10 is preceded by a driver circuit 40 by which the input signal having the low current $I_i$ can be applied to the adapter circuit 10.

The driver circuit 40 is connected to a low-voltage source 42 providing a low voltage $U_i$ in the range from approximately 1 V to approximately 3.3 V, by which the driver circuit 40 supplies a DC signal having a current $I_{i,dc}$ of approximately 1 mA which is superimposed by an AC signal having a current $I_{i,ac}$ of approximately 1.12 mA (measured from peak to peak).

Such low voltage values $U_i$ in the range of approximately 1 V to approximately 3.3 V (and thus low currents $I_i$ of the order of mA) are very desirable because of the necessity to use integrated circuits with very low operating voltages, but a signal intended for the SCART output 70 of the television, multimedia, radio or video recording device must have an output level width (peak to peak) exceeding the low voltage values $U_i$ by a multiple.

For this reason, the adapter circuit 10 has its input 12 connected to an npn transistor arrangement 14 operating as a current mirror but not amplifying the signal (ratio 1:1). Arranged in series after the npn transistor current mirror 14 is an npn transistor arrangement 16 also operating as a current mirror and, in contrast to the npn transistor current mirror 14, amplifying the signal by an amplification factor of 5 (ratio 1:5). To this end, the pnp transistor current mirror 16 is connected to a high voltage source 30 which supplies a voltage of approximately 12 V so that the voltage of the high voltage source 30 exceeds the voltage $U_i$ in the low voltage range (=driver circuit 40) by a multiple.

For connection to the pnp transistor current mirror 16, the adapter circuit 10 has the output 18 which is assignable to the range of higher voltage $U_o$ and precedes a resistor 50 for converting the output signal of a higher current $I_o$ into an output signal of a higher voltage $U_o$. This resistor 50 has a value of approximately 1 kΩ and converts the DC signal from a current $I_{o,dc}$ (=n·$I_{i,dc}$) of approximately 5 mA (=5·1 mA) into a voltage $U_{o,dc}$ (=R·n·$I_{i,dc}$) of approximately 5 V (=1 kΩ·5·1 mA); this conversion goes together with a conversion of the AC signal from a current $I_{o,ac}$ (=n·$I_{i,ac}$) of approximately 5.6 mA (=5·1.12 mA; measured from peak to peak) into a voltage $U_{o,ac}$ (=R·n·$I_{i,ac}$) of approximately 5.6 V (=1 kΩ·5·1.12 mA; measured from peak to peak).

It is particularly advantageous that the integrated adapter circuit 10 shown in FIG. 1 is current driven, i.e. not voltage driven, particularly as far as the output of the pnp transistor 16 is concerned, which to a certain extent behaves as a current source. Consequently, the signals of the adapter circuit 10 are very insensitive to electromagnetic interference and disturbances. Moreover, the audio output voltage control range can be raised by approximately 5 dB in the example described above.

Although it cannot be explicitly derived from FIG. 1, the circuit arrangement according to the invention may also have more than one adapter circuits. For example, preferably four adapter circuit stages for two SCART stereo outputs may be provided, the circuit arrangement then comprising eight npn transistors and 24 pnp transistors and the four adapter circuits each preceding a resistor.

It should be noted that no noticeable change of the total harmonic distortion (THD) can be achieved with the circuit arrangement according to the present invention. This advantage is illustrated in the following Table in which the relevant total harmonic distortion (in dB) is shown at a given frequency f (in kHz) and at a given effective value of the output voltage $U_{o,rms}$ (in V) by square root extraction from the root mean square (rms):

| f\$U_{o,rms}$ | 0.5 V | 1 V | 2 V | 3 V |
|---|---|---|---|---|
| 1 kHz | −64.8 dB | −58.8 dB | −54.2 dB | −48.1 dB |
| 5 kHz | −67.2 dB | −60.3 dB | −54.5 dB | −49.1 dB |
| 20 kHz | −67.6 dB | −61.8 dB | −54.8 dB | −49.2 dB |

In this respect it should be noted that the above-mentioned values were obtained with a DC signal of a current $I_{i,dc}$ of approximately 1.7 mA superimposed by an AC signal of a current $I_{i,ac}$ of approximately 1.7 mA (measured from peak to peak), the amplification factor n was 3, and the adapter circuit fed by a 12 V high voltage source 30 preceded an 1 kΩ resistor 50 and a 2.2 nF load (not shown, from 70 to ground).

Although these data partially deviate to a small extent from the data of the circuit arrangement 100 described with reference to FIG. 1, the above-mentioned measuring values of the total harmonic distortion illustrate the predominance of the circuit arrangement according to the invention over conventional circuit arrangements, particularly with respect to complying with the requirements of the Dolby digital C standards and to the absence of any parasitic oscillations, even under full load.

LIST OF REFERENCE SIGNS

100 circuit arrangement
10 adapter circuit
12 input of the adapter circuit 10
14 npn transistor current mirror
16 current mirror
18 output of the adapter circuit 10
30 high-voltage source
40 supply or driver circuit
42 low-voltage source
50 resistor
60 coupling capacitor
70 SCART output
n amplification factor
$I_i$ low current of the input signal
$I_o$ higher current of the output signal
$U_i$ low voltage
$U_o$ higher voltage

The invention claimed is:

1. A circuit arrangement, comprising:
at least one adapter circuit (10), which amplifies an analog input signal of a low current (Ii) by an amplification factor (n) into an analog output signal of a higher current (Io), the at least one adapter circuit further comprising:
an input (12), which corresponds to a range of low voltages (Ui);
an output (18), which corresponds to a range of higher voltages (Uo);
at least one npn transistor current mirror (14); and
at least one pnp transistor current mirror (16) arranged in series with the npn transistor current mirror (14), and connected to at least one high voltage source (30), wherein the at least one pnp transistor current mirror comprises a plurality of pnp transistors connected in parallel on its output side and amplifies the input signal, which is received from the at least one npn transistor current mirror.

2. A circuit arrangement as claimed in claim 1, characterized in that the amplification factor (n) is approximately 5.

3. A circuit arrangement as claimed in claim 1, characterized in that the signal is amplified in the pnp current mirror (16) or in the pnp transistor current mirror (14).

4. A circuit arrangement as claimed in claim 1 characterized in that the high voltage source (30) supplies a voltage of the order of approximately 12 V.

5. A circuit arrangement as claimed in claim 1, characterized in that the input (12) of the adapter circuit (10) is preceded by at least one supply or driver circuit (40) by which the low current (Ii) input signal can be applied to the adapter circuit (10).

6. A circuit arrangement as claimed in claim 5, characterized in that the supply or driver circuit (40) is connected to at least one low voltage source (42).

7. A circuit arrangement as claimed in claim 6, characterized in that the low voltage source (42) supplies a voltage of the order of approximately 1 V to approximately 3.3 V.

8. A circuit arrangement as claimed in claim 1, characterized in that the npn transistor arrangement (14) is constituted as an npn current mirror and/or particularly as an NMOS current mirror (NMOS=N-channel Metal Oxide Semiconductor=N-type Metal Oxide Semiconductor); and/or the pnp transistor arrangement (16) is constituted as a pnp current mirror and/or particularly as a PMOS current mirror (PMOS=P-channel Metal Oxide Semiconductor=P-type Metal Oxide Semiconductor).

9. A circuit arrangement as claimed in 1, characterized in that the output (18) of the adapter circuit (10) precedes at least a resistor (50) for converting the higher current (Io) output signal into a higher voltage (Uo) output signal.

10. A circuit arrangement as claimed in claim 9, characterized in that the resistor (50) has a value of approximately 1 k$\Omega$.

11. A circuit arrangement as claimed in claim 1, characterized in that the output (18) of the adapter circuit (10) precedes at least a SCART (=Syndicat des Constructeurs d'Appareils Radio Receteurs et Televiseurs) output (70).

12. A circuit arrangement as claimed in 1, characterized in that the adapter circuit (10) is multi-staged and/or more than one adapter circuit (10) is provided.

13. A circuit arrangement as claimed in claim 12, characterized in that eight npn transistors (14) and 24 pnp transistors (16) are provided, and in that the four-stage adapter circuit (10) or the four adapter stages (10) precede a resistor (50).

14. A television, multimedia, radio or video recording device comprising at least a circuit arrangement (100) as claimed in claim 1.

* * * * *